United States Patent [19]
Boll et al.

[11] Patent Number: 6,118,287
[45] Date of Patent: Sep. 12, 2000

[54] PROBE TIP STRUCTURE

[76] Inventors: Gregory George Boll, 2720 Coach House La.; Harry Joseph Boll, 2780 70th St. SW., both of Naples, Fla. 34105

[21] Appl. No.: 08/987,640

[22] Filed: Dec. 9, 1997

[51] Int. Cl.[7] .................................................. G01R 31/02
[52] U.S. Cl. ........................ 324/754; 324/158.1; 324/762
[58] Field of Search ..................................... 324/754, 762, 324/158.1

[56] References Cited

U.S. PATENT DOCUMENTS

| | | | |
|---|---|---|---|
| 4,871,964 | 10/1989 | Boll et al. | 324/754 |
| 5,373,231 | 12/1994 | Boll et al. | 324/158.1 |
| 5,506,515 | 4/1996 | Godshalk et al. | 324/762 |
| 5,565,788 | 10/1996 | Burr et al. | 324/762 |

*Primary Examiner*—Safet Metjahic
*Assistant Examiner*—T. R. Sundaram
*Attorney, Agent, or Firm*—Werner H. Schroeder

[57] ABSTRACT

A probe tip structure is disclosed which is obtained from a solid piece of material having a bore machined therein which extends from a first end where the probe tip is attached to a coaxial transmission line to a second end where contact points are machined therein. The inner conductor of the transmission line extends into the bore to the second end of the probe tip where another contact point is formed. All contact points are adapted to contact a device under test. A rigid insulating structure is placed within the bore of the probe tip to hold the inner conductor securely in a fixed position.

19 Claims, 9 Drawing Sheets

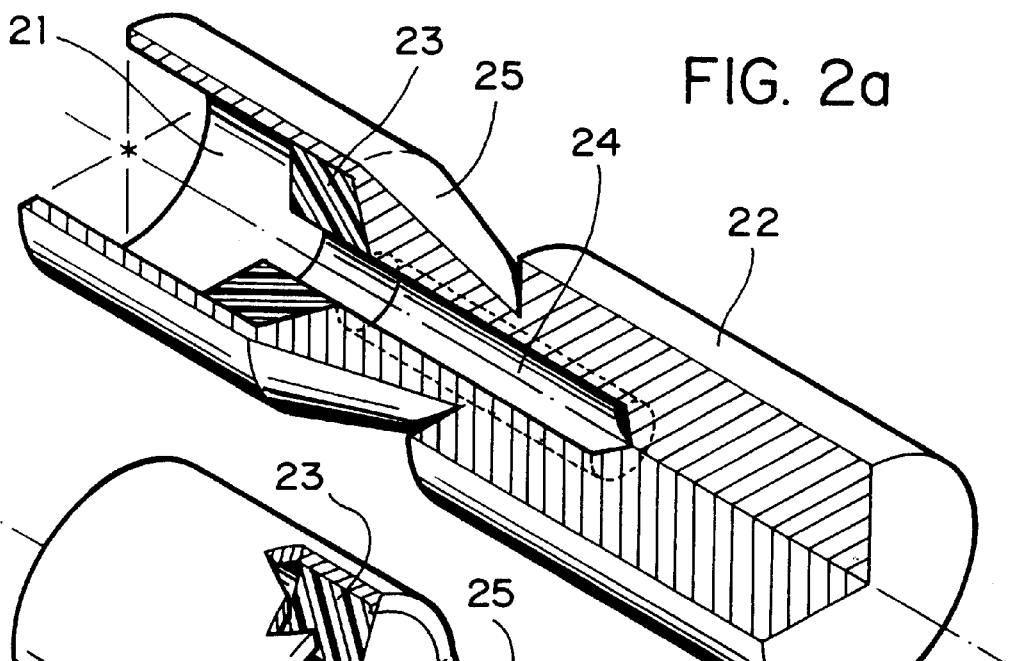
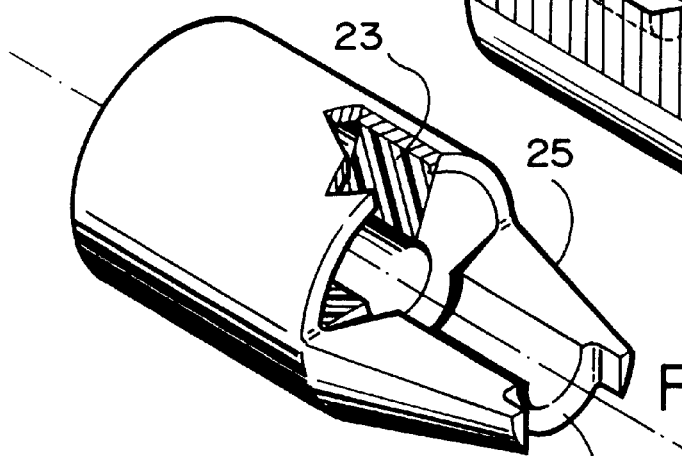
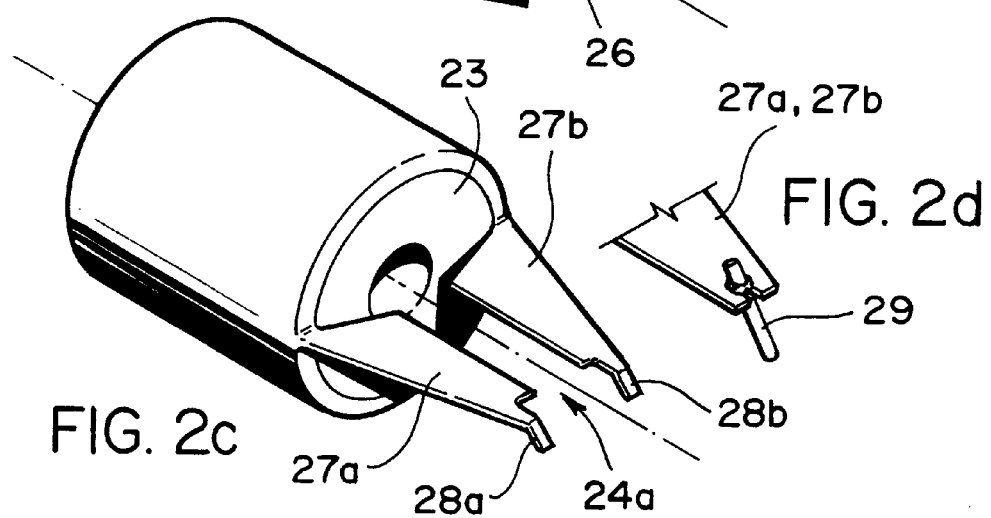

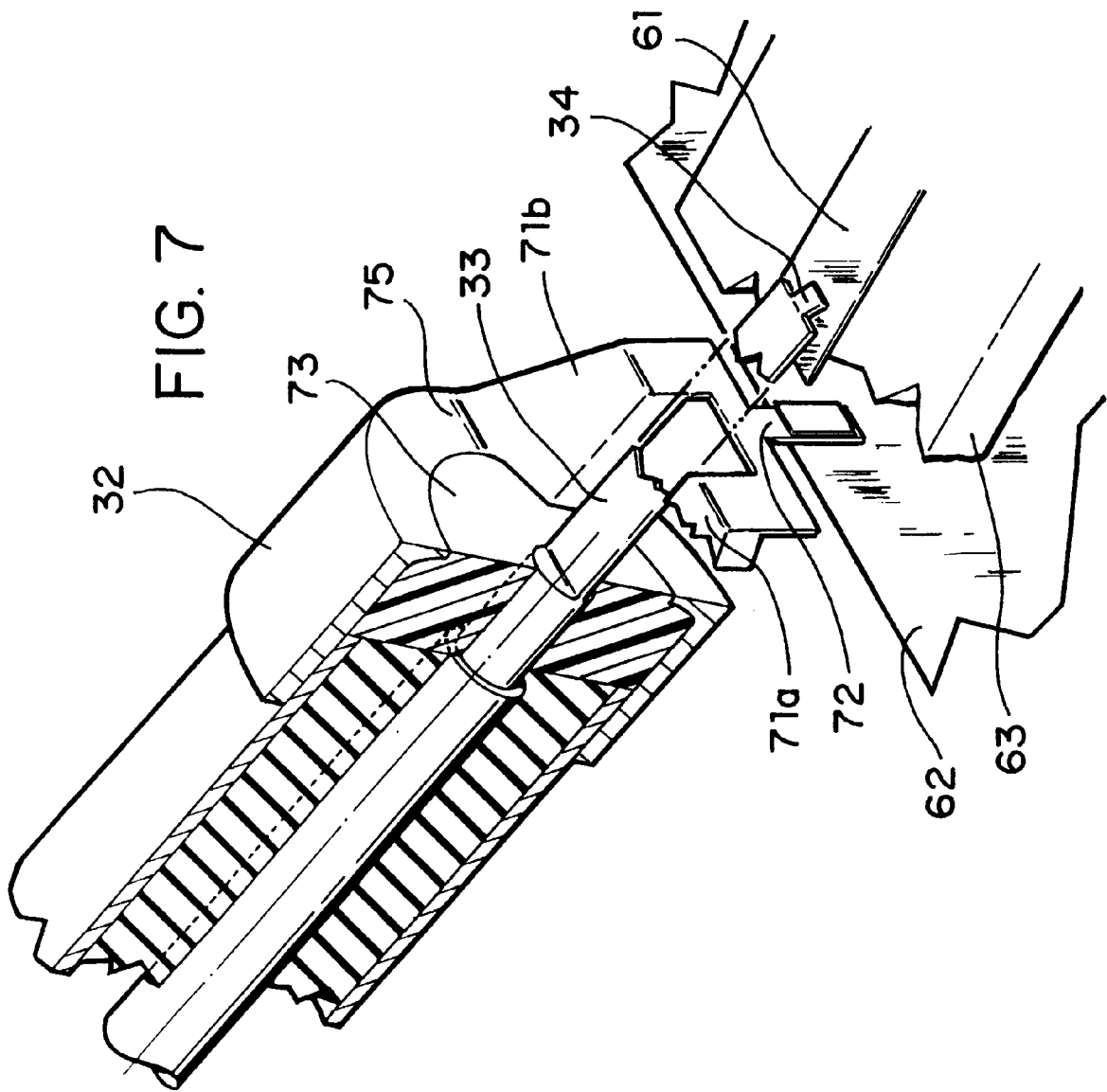

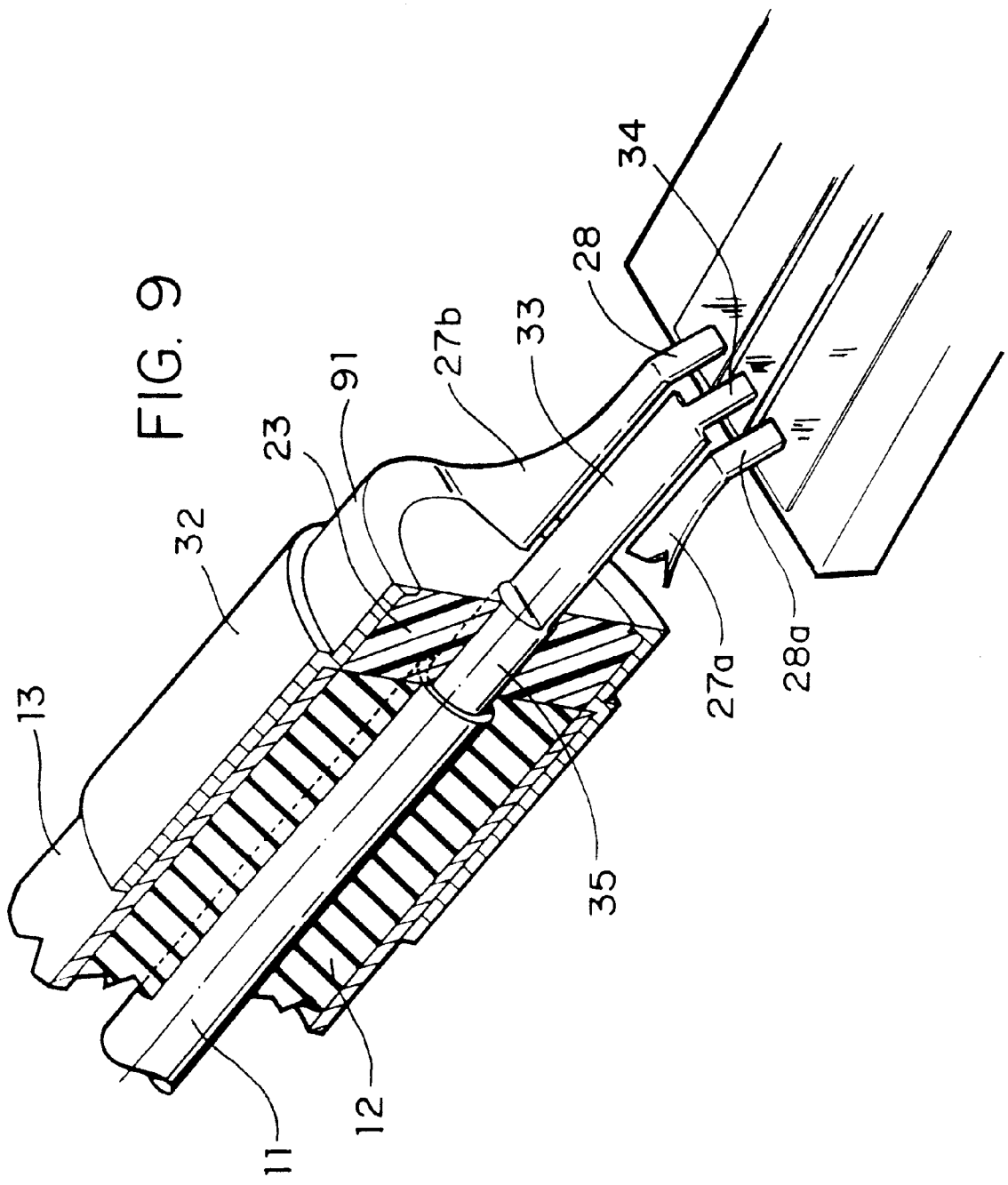

PROBE TIP STRUCTURE

FIELD OF THE INVENTION

This invention relates to probe devices for testing high speed integrated circuits including microwave and millimeter wave circuits and to integrated circuits while part of a slice or wafer and to hybrid integrated circuits where a number of individual chips (or dies) are connected to or bonded to a printed circuit or ceramic substrate. Such probe devices may be individually mounted on a probe testing apparatus or a number of probes may be mounted on a common probe card.

BACKGROUND OF THE INVENTION

Probe devices for testing integrated circuits (IC's) require reliable means for making contact to the circuit that is to be tested while at the same time causing minimal damage to the metal probe pads on the circuit. Early probe devices described in U.S. Pat. Nos. 4,697,143 and 4,827,211 did not have mechanically compliant contacting members and are no longer in general use because they did not male reliable contacts to the device under test (DUT). Our U.S. Pat. No. 4,871,964 and those of U.S. Pat. No. 4,894,612 and U.S. Pat. No. 5,506,515 describe probes with mechanically resilient contacting members that allow much more reliable probing. A similar structure by Ranieri et. al. (A Novel 24-GHz Bandwidth Coaxial Probe, IEIE Trans. Instr. and Meas., Vol. 39, No. 3, June, 1990) also describes mechanically resilient probe tips. However, the new structures, although highly superior in performance than the previous probes, are somewhat difficult and costly to manufacture. In particular, during the soldering or brazing operation when the resilient tips are fastened to the probe body, it is difficult to assure the accurate placement of the contacting tips. U.S. Pat. No. 5,565,788 in FIGS. 6 and 6a shows a probe tip having a cylindrical section 102 and a forward tapered and slanting section 104. The specification is silent as to how this probe tip was manufactured. It certainly cannot be machined with techniques described below. Furthermore the impedance of the contacting tips is dependent on the impedance of the coaxial tip portion, and results in a tip impedance that is always higher than that of the coaxial portion

OBJECTS OF THE INVENTION

Whereas prior art probe tip structures are constructed from separate elements that are soldered or brazed together, this specification discloses structures made from a single piece of material. Advantages include less expensive assembly, better control of tip dimensions and less susceptibility to damage during use. Therefore, it is a primary object of this invention to provide a structure that can be easily manufactured with close tolerances and still retain the resilient properties of the contacting tips.

BRIEF DESCRIPTION OF THE DRAWINGS

FIGS. 2a, 2b, 2c and 2d show the manufacturing steps of a first version of a probe tip.

FIG. 7 shows a probe tip structure for probing non-planar circuits with varying thickness.

FIG. 9 shows a probe tip structure with stepped diameter.

DETAILED DESCRIPTION

Figure 1:
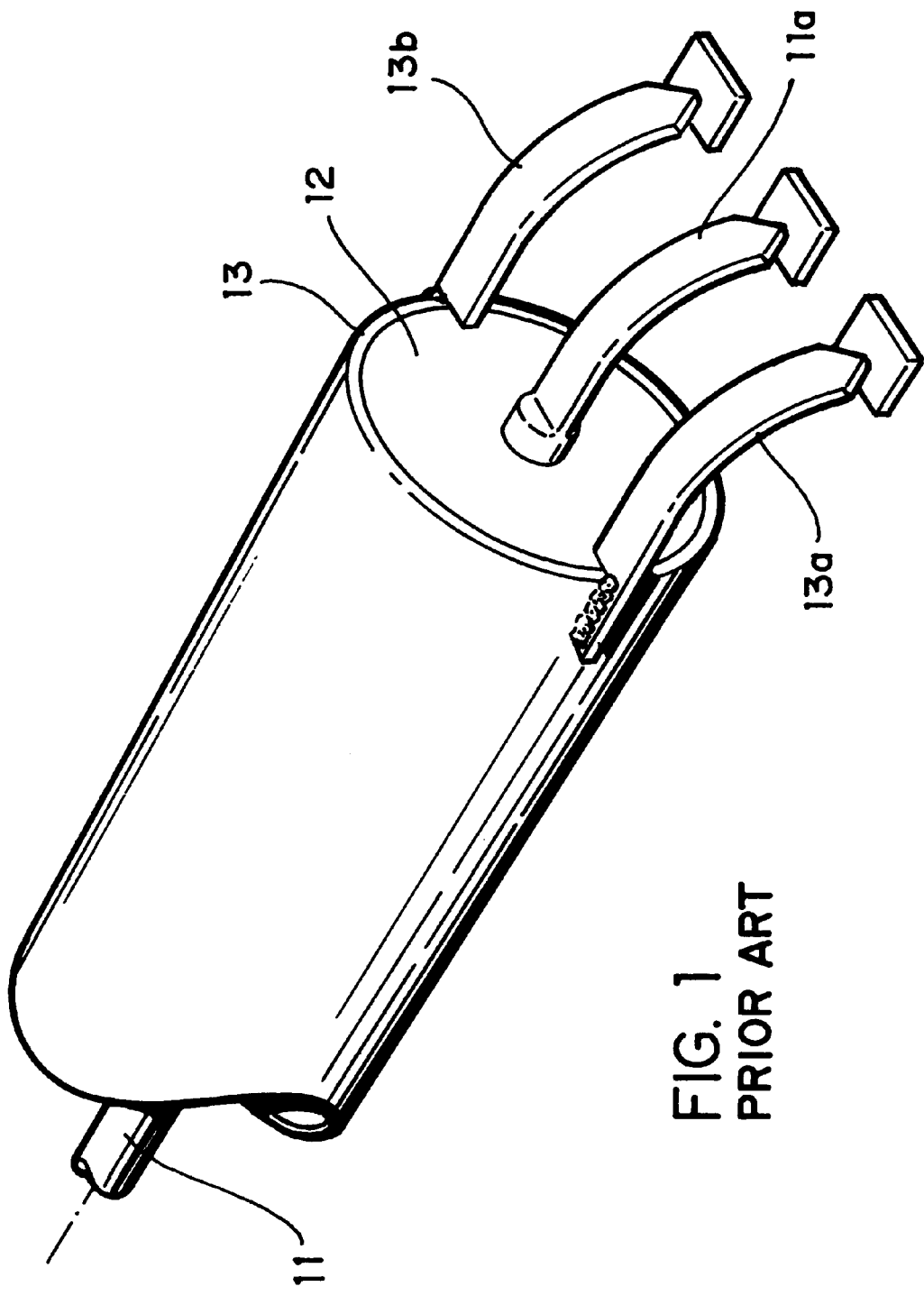
FIG. 1 shows the tip structure of a typical prior art probe.

FIG. 1 shows a the details of the tip structure of a prior art probe. Important features are a probe body consisting of a coaxial transmission line with an inner electrical conductor 11 surrounded by an insulating sheath 12 which in turn is surrounded by an electrically conducting outer shield 13. Although the center conductor may be extended as shown to form a contacting tip 11 a as shown, a separately manufactured contacting tip 11 a which may be a different material than 11 may be fastened to the inner conductor 11 in a variety of ways including soldering, welding or brazing. The contacting members 13a and 13b may be connected to the shield 13 in a variety of ways including soldering or brazing into slots cut into the shield. The performance of such a probe depends critically on the two spacings between the three contacting members, and the tips of the contacting members must be placed accurately in both the horizontal and vertical directions so that all three tips contact the DUT properly. It is difficult to perform the soldering or brazing operation while holding the tips in their proper positions. Usually, after assembly, the tips must be adjusted manually by delicately bending them to put them into the precise position required. The manual adjustments are very tedious and time consuming and therefore are expensive.

FIG. 2c shows a structure according to this specification where the contacting members 13a and 13b of FIG. 1 may be accurately constructed from a single piece of electrically conducting material by machining methods as follows:

As shown in FIG. 2a, a hole 21 is bored into one end of a solid metal rod 22. Of course, it is well known that any bore represents a symmetry about its axis. Rod 22 may be any suitable metal such as copper, nickel, steel or beryllium-copper alloy. An electrically insulating plug 23 may then be inserted into the bore 21 and a second smaller bore 24 may be drilled through the plug 23 and into the rod as indicated. The insulating plug 23 may be simply a portion of an insulating rod of the proper diameter to fit inside 21 and fastened in place or it may be an insulating compound that is inserted in liquid or paste form that hardens on cooling or by chemical polymerization. Insulating plug 23 may also be formed by inserting an insulating powder that is subsequently sintered by heating to form a solid mass. The bore 24 through insulating plug 23 will accommodate the inner conductor of the coaxial line as described in conjunction with FIG. 3. Alternatively, the insulating plug 23 with drilled bore 24 may be inserted later or the insulating plug 23 may be formed by the flowing an insulating compound described above into the empty space that will become 23 in the completed probe structure of FIG. 3. A taper 25 may be cut into the outer diameter of 22. A 90 degree cutaway is shown in FIG. 2a to reveal the internal drill holes and the insulating plug. The drilled piece is then held with a chuck by the left end and the drilled portion is cut away from the parent solid rod at the small end of the tapered region 25. A portion of the tapered region 25 is then machined away as shown in FIG. 2b and a step 26 is machined into the end. Then the bottom of the tapered region 25 is machined away leaving the structure shown in FIG. 2c with thin, mechanically flexible members 27a and 27b and downwardly projecting fingers 28a and 28b. In some applications, only one member 27a with 28a or 27b with 28b is required. In that case one or the other of the two members is machined away. Advantageously, the fingers 28a and 28b are shaped as shown so that the area of contact between the DUT and the tips of 28a and 28b remains relatively constant as the tip wears during use. This is particularly important when probing circuits with aluminum metallization because after repeated probing, there is a residue that remains on the contact surfaces of 28a and 28b that impairs the contact reliability. To remove the residue the contacting surfaces are frequently abraded to expose fresh, uncontaminated contacting surfaces. Each cleaning removes a small portion of the tip metal. Because of the small, uniform cross-section of 28a and 28b and the nearly vertical angle, the tips may be cleaned many times without significantly changing the area or relative positions of the contacting surfaces. For ease of manufacture and/or for better electrical characteristics it may be desirable to omit the downwardly projecting tips 28a and 28b or have them extend forward in the same plane as 27a and 27b. In some situations special materials such as tungsten or other metal that is difficult to machine may be required for the contacting elements. In that case it may be advantageous to attach a short auxiliary contacting element 29 of tungsten, for example, to the flexible members 27a and 27b as shown in FIG. 2d. This may be done by cutting a short slot into 27a,b as shown and soldering, brazing or welding 29 to 27a,b or by fitting 29 into a hole drilled through 27 or by simply soldering or brazing 29 to 27a,b. Alternatively, contacting tips 28 may be electroformed or plated onto 27a,b in a variety of other ways. Furthermore another metal such as rhodium, for example, may be plated onto 28 to produce a better contacting surface. Another method for fabricating the structure of FIG. 2c is discussed later in conjunction with FIG. 8.

Figure 3:
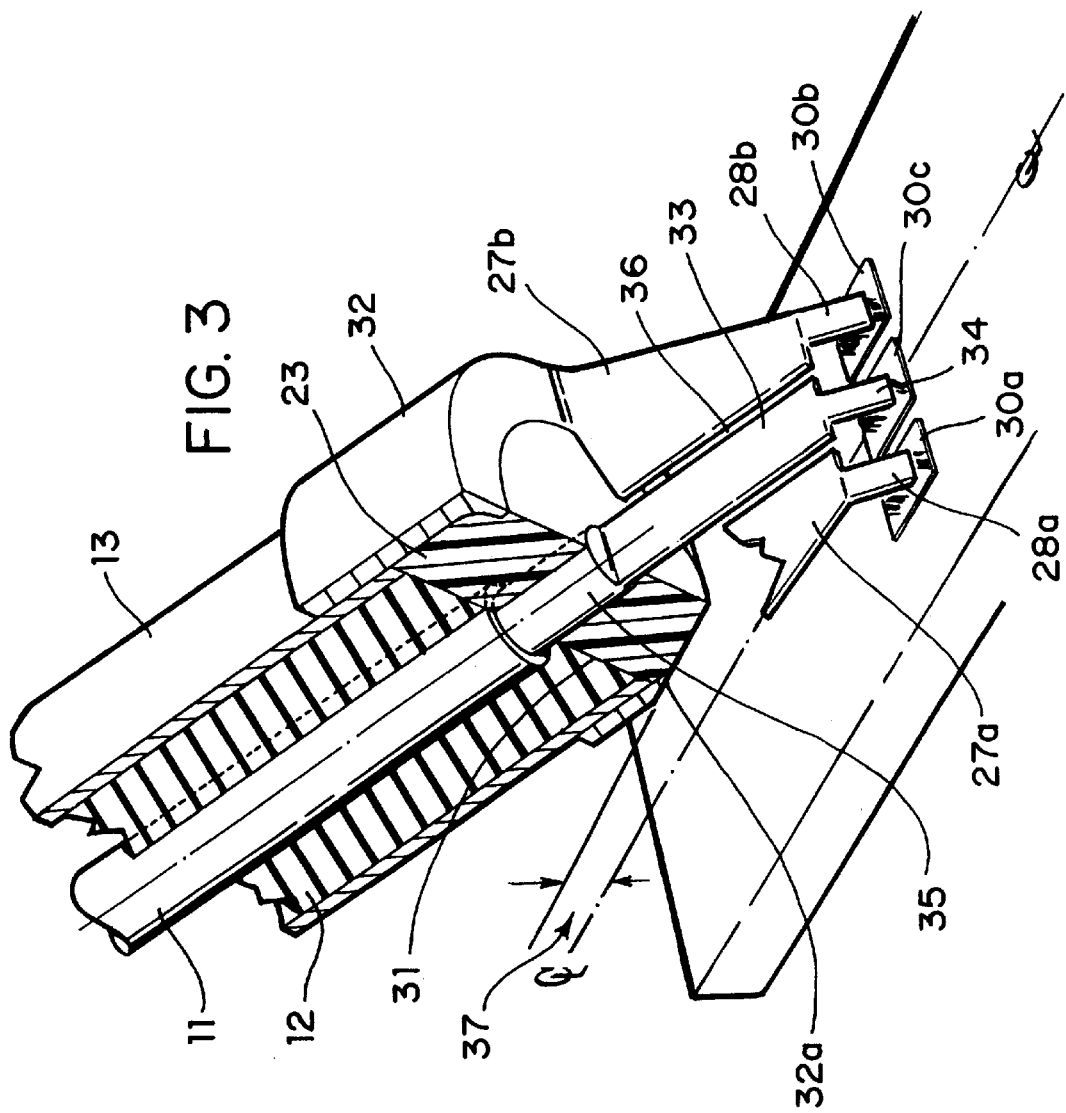
FIG. 3 shows the probe tip of FIG. 2c fastened to the end of a coaxial line.

The completed tip of FIG. 2c may then be attached to the end of a coaxial line consisting of an inner conductor 11, insulator 12 and outer shield 13 as shown in cross-section in FIG. 3. The tip is shown making contact to a device to be tested that has electrical conductors 30a, 30b and 30c. Before attaching the tip structure of FIG. 2c, the coaxial cable structure may be prepared by cutting away a portion of the shield 13 and the insulator 12 to the point 31, FIG. 3, allowing a length of inner conductor to protrude. The inner conductor extension 33 and the contacting tip 34 may be machined out of the inner conductor 11 into the shape shown by methods similar to those outlined in the description of FIGS. 2a, 2b and 2c. On the other hand, the center conductor with its tip structure may be machined separately from another conducting material and inserted into the coaxial outer shield. The spacing 36 between 33 and 27a,b is usually chosen so that the impedance of the tip structure matches that of the coaxial line. Advantageously, the members 27a and 27b and possibly 33 are wide and thin to provide mechanical flexibility in the vertical directions and be relatively rigid in the horizontal directions to maintain an accurate spacing 36. The diameter of bore 21 of FIG. 2a is appropriate to fit over the outside of the shield 13 and the connection between the shield 13 and the structure of FIG. 2c may be made by soldering, brazing or welding or any other suitable method including press fitting or by the use of screw threading. Although we have indicated the structure of FIG. 2c fitting over the shield 13, instead, in a straightforward way, a butt connection could be made between the structure of FIG. 2c and the insulator 12 may extend into a proper diameter bore 21. It is also possible to fit the structure of FIG. 2c inside the shield 13 by machining the outer diameter of 32 to fit inside 13. In that case a portion of insulator 12 would be cut back inside the coaxial line to accommodate the structure of FIG. 2c. Depending on the lengths of 27a,b and 28a,b the diameter of 32 and the angle that the coaxial line makes with respect to the DUT, it may be necessary to remove a portion 32a from the bottom of the outside diameter 32 to provide a space 37 to prevent contact between the circuit under test and the bottom edge of 32.

In situations where the insulator 12 is soft and resilient, the inserted insulator 23 should be strong and rigid to hold the center conductor 11 and extension 33 securely in the proper position while probing forces are applied to the tip 34. If 23 has a higher dielectric constant than 12, the inner conductor 11 may be reduced to a smaller diameter section 35 to provide the same impedance as the remainder of the coaxial line. As indicated previously the insulator 23 may be inserted early in the manufacturing process as described in conjunction with FIG. 2a or it may be inserted later as discussed in conjunction with FIG. 2c or even later after the coaxial line has been fastened to the tip structure 32 by forcing a liquid, paste or powder insulator into a void left between the inner conductor and the inside of 32. If the insulator 12 of the coaxial line is sufficiently strong and rigid to hold the center conductor 11 in place, then it is not necessary to include the insulator 23, FIG. 3.

Figure 4:
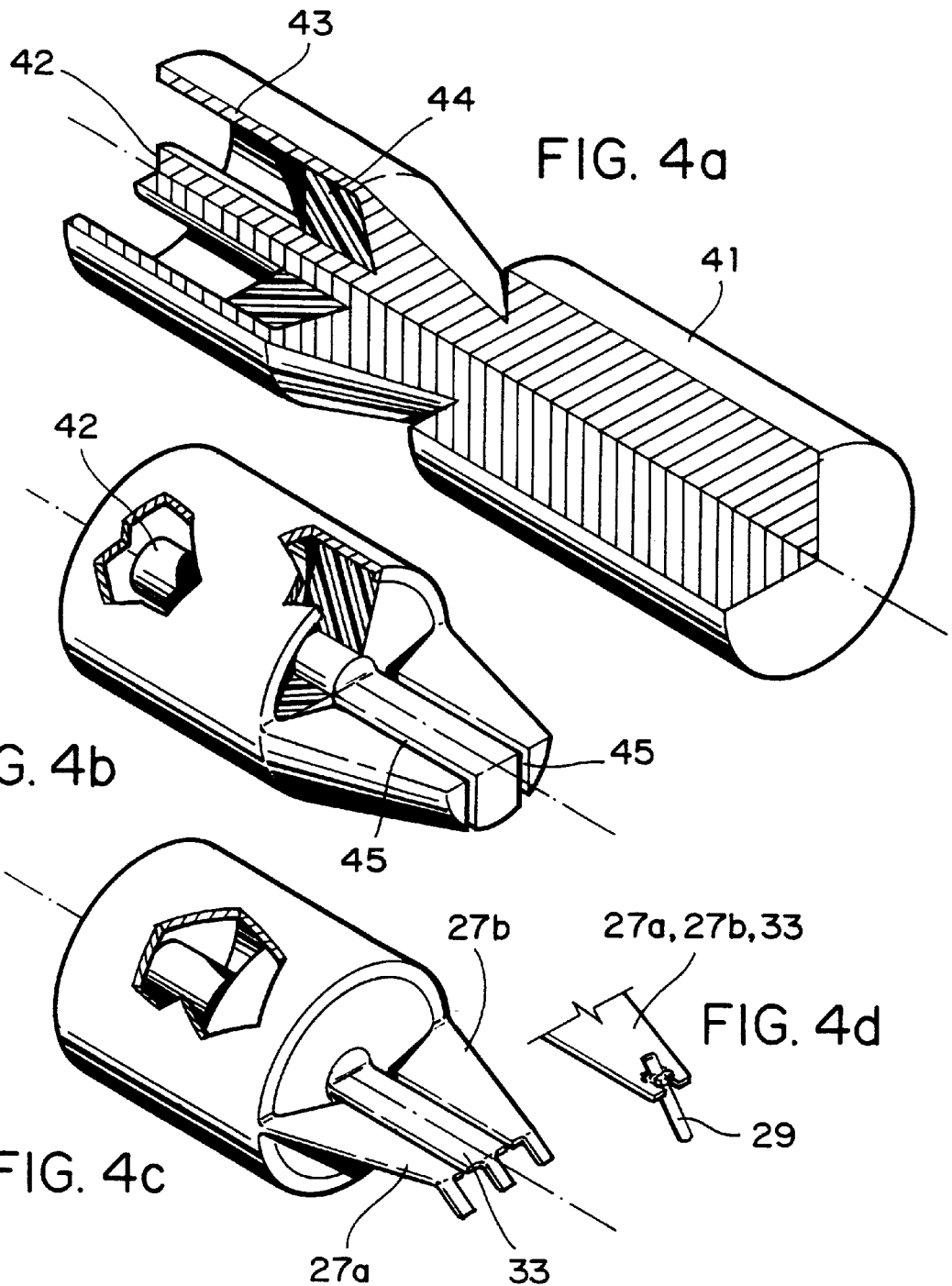
FIGS. 4a, 4b, 4c and 4d show the manufacturing steps of a second version of a probe tip.

An alternative and somewhat more complicated method for manufacturing a tip structure is shown in FIGS. 4a, 4b and 4c. Here a structure similar to that of FIG. 2a is machined from a solid rod of material 41 except that material to form an inner conductor 42 is retained. A portion of the space between the inner conductor 42 and the outer conductor 43 is filled with an insulating material 44 having desired mechanical and electrical properties. The probe tips are then machined in a manner similar to that described in conjunction with FIGS. 2a, 2b and 2c except that slots 45 are cut as shown in FIG. 4b to separate the center conductor from the shield 42. By machining off the remaining metal we are left with the structure of FIG. 4c which can be attached to a coaxial line in a manner similar to that described in conjunction with FIG. 3. Separate contacting elements as indicated in FIG. 2d may also be attached to the structure of FIG. 4c.

Figure 5:
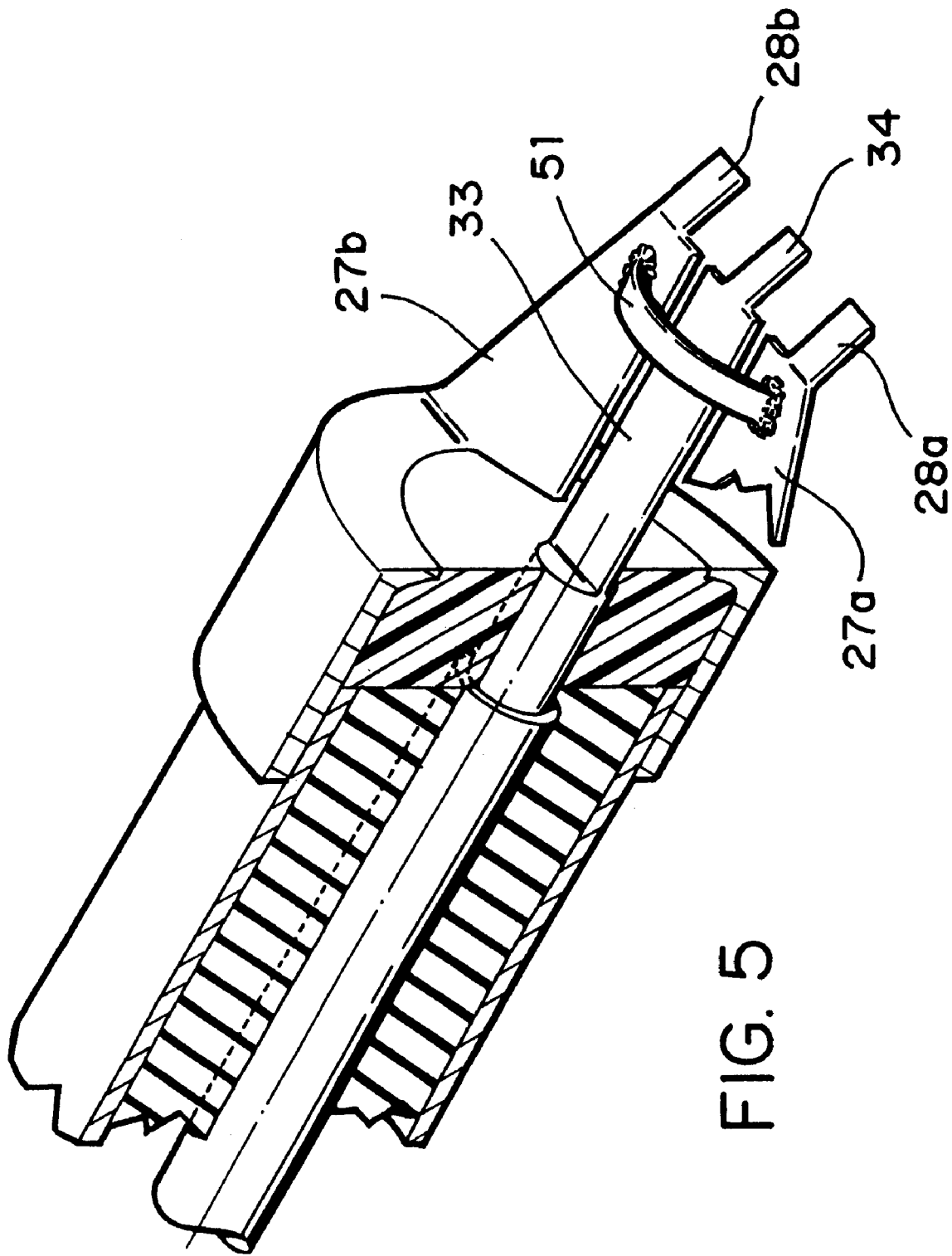
FIG. 5 shows a tip with electrically coupled elements.

For some applications as shown in FIG. 5, it is important that the shield connections 27a and 27b are coupled together electrically and/or the tip portion of the inner conductor 33 needs to be shielded to reduce the electrical coupling to other parts of the test setup or the circuit under test. FIG. 5 shows an electrically conducting strip 51, which advantageously may be mechanically resilient, connected between the elements 27a and 27b. Strip 51 may be affixed by welding, brazing, soldering or with electrically conductive adhesive. Alternatively, the strip 51 may be machined in place during the machining operations that produce the structures of FIG. 2c or FIG. 4c . Strip 51 may be placed above 33 as shown or below 33 or two strips above and below may be used.

Although many devices to be tested require co-planar tips as indicated in FIGS. 1, 3, 4c, 5 and 9 there are other testing situations that require nonplanar probes. An example of such a structure is the stripline 61 shown in FIG. 6. Here the connection to the ground plane 62 under line 61 is below the plane of line 61 by the thickness of the insulator 63. By properly angling the ground connection 64 one can ensure that when 64 is pressed up against the side of the insulator 63 the tip 34 of inner conductor 33 makes contact with line 61 at a predetermined point. A spacer 65 which may be an insulator may be added to 64 to ensure the proper position.

Figure 6:
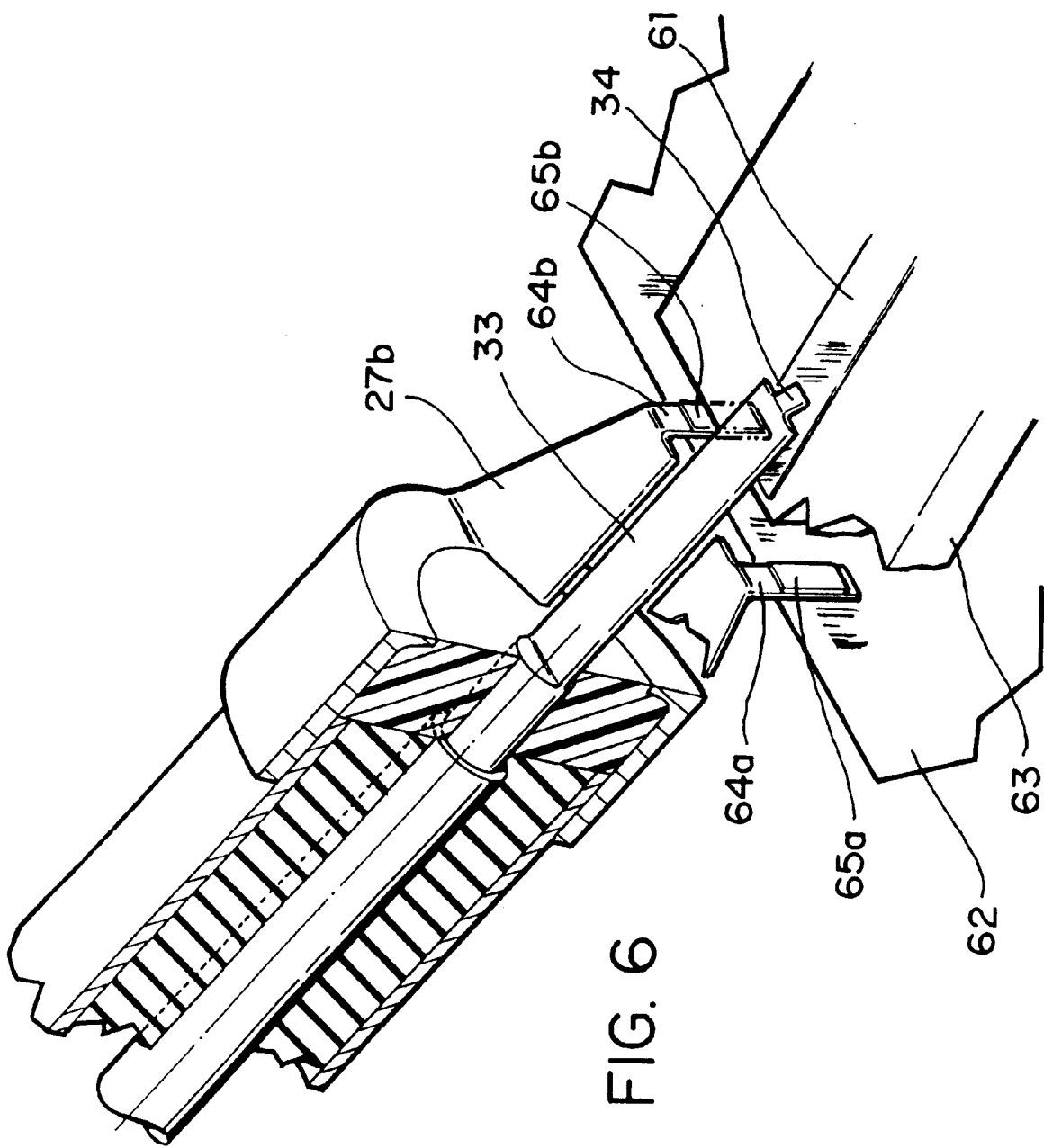
FIG. 6 shows a probe tip structure adapted for probing non-planar circuits.

A structure similar to that of FIG. 6 is shown in FIG. 7 and is intended to accommodate striplines or other structures with differing insulator thickness 63. Here the shield fingers 71a,b are thick and they may be as thick or even thicker than the diameter of 32. When the probe tip 34 contacts the stripline 61, 33 flexes which then allows the shield connection 72 to make contact to the ground plane 62. Thus, when probing a stripline with a thicker or thinner insulator, the center conductor extension 33 will be higher or lower in the slot formed by the extensions 71a,b but the impedance formed by 33 and 71a,b will be substantially unchanged. In this case 71a,b will be relatively rigid so that as the probe is brought into stronger contact with the ground plane (termed overprobing in the industry), the coaxial line flexes to prevent damage to the probing surfaces. To provide some mechanical flexibility, 71a,b could be made very thin at 75 where 71a,b connect to the structure 32. This is allowable because those portions of 33 and 71 that are near the insulator face 73 move very little as 33 and 71a,b flex. The finger 72 ensures a single point of contact to ground plane 62 but may be omitted in some applications.

Figures 8A, 8B, 8C:
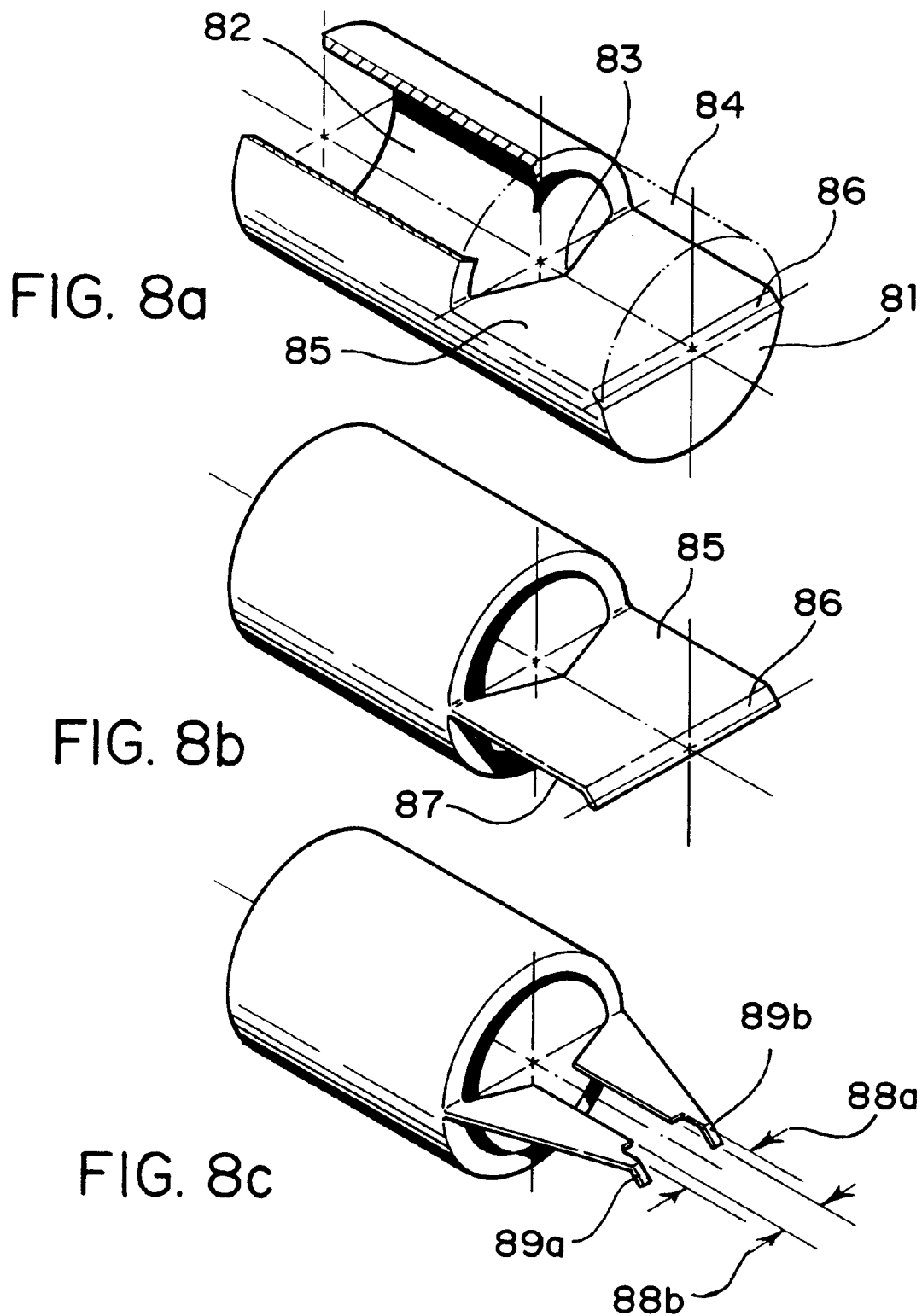
FIGS. 8a, 8b and 8c show an alternative tip manufacturing method.

A structure similar to that of FIG. 1c may also be fashioned as outlined in FIGS. 8a, 8b and 8c. Again we begin with a metallic rod 81 and bore a hole from the left to produce a bore 82 to the depth 83. We then machine away the material 84 to form the flat surface 85 and a sloping section 86. The drawing has a 90 degree cutaway to reveal the inside of the drilled hole. The bottom of 81 under 85 and 86 is then machined away to leave the structure of FIG. 8b that includes the metallic web 87. Then the edges of web 87 are machined away to leave the structure of FIG. 8c. An insulator with hole to accommodate the inner conductor of the coaxial line may then be inserted into FIG. 8c to produce the structure of FIG. 2c. Alternatively, as described previously, the coaxial line with inner conductor protruding may be inserted first and then an insulator in liquid, paste or powder form that hardens by heating may be inserted. An advantage of this construction method is that structures of FIG. 8b may be stockpiled and then the pitch between the two contact points 89a and 89b may be custom made by machining away more or less of the outer edges of the web 87 of FIG. 8b. The width of contacting elements 89a and 89b may be tailor made by controlling the difference between 88a and 88b. Also, the space 88b may be custom made to provide a space 36, FIG. 3, to achieve the tip impedance required.

Although we have described only the preferred embodiments of our invention, those skilled in the art may devise variations that do not significantly differ from the spirit and scope of our invention. For example, in FIG. 2a a single, uniform diameter 21 is indicated to fit to the shield 13 of the coaxial line as shown in FIG. 3. It may be advantageous to taper or step down the diameter of 32 to allow a small tip structure with a relatively large coaxial line. A stepped structure with step 91 is illustrated in FIG. 9; a much larger step or steps could produce a smaller tip end. The coaxial line itself could be tapered in diameter to fit a very small tip structure or to effect an impedance transformation as described in our application Ser. No. 08/866,081. Also, in all our drawings we show two tip structures 27a and 27b that connect to the coaxial shield, whereas in many applications only one element 27a or 27b is required. In FIG. 3, the tip portions 33 and/or 27a,b may be tapered in width and/or thickness instead of being uniform as shown. The space 36 may be larger or narrower to produce an impedance that differs from that of the coaxial line or the space 36 may be tapered to produce an impedance that varies from one end of 33 to the other or the space may be filled with an insulator other than air. Such impedance variations may be desirable in those situations where the device under test does not present a pure resistive impedance but has a reactive component. Furthermore, although we have shown 27a,b and 33 coplanar in FIGS. 3, 4c, 5 and 9, 27a or 27b could be situated above or below the plane of 33 or above one another as described in the aforementioned paper by Ranieri et. al. In addition, the elements 27 and 28 may be situated slightly below the plane of 33 and 34 so that as the probe is brought into contact with the DUT the members 28 make contact first and members 27 then flex to allow 34 to make contact. This principle is described in detail in our U.S. Pat. No. 4,871, 964. Also, in FIG. 6, the elements 27 and/or 64 may be connected together as shown in the drawing of FIG. 7 producing a single contact to the DUT. Additional components such as capacitors, inductors, diodes, transistors or other elements may be attached to the tip to provide special functions.

We claim:

1. A Probe tip structure for connection to an end of a coaxial transmission line having an inner electrical conductor surrounded by an outer electrically conducting shield, said probe tip structure consisting of a solid piece of electrically conducting material having a bore therein at one end thereof, said bore is symmetrical about its axis, and further having at least one electrically contacting member at another end thereof and machined therefrom, said contacting member itself having an end adapted for making contact to a circuit to be tested, said bore extending farther into said probe tip with a smaller size which is also symmetrical about its axis adapted to receive said inner conductor therein said inner conductor also having an end adapted for making contact to said circuit to be tested, a spacing between said contacting member and said inner conductor is chosen to control the impedance of said probe tip structure.

2. A probe tip structure according to claim 1 having an auxiliary electrically conductive element attached to said end of said contacting element to improve the reliability of the electrical contact between said contacting member and said circuit to be tested and/or to improve the wearability of the electrical contact.

3. A probe tip structure according to claim 1 or 2 including a rigid insulating structure inside a portion of said probe tip structure to hold the inner conductor of said coaxial transmission line securely in a fixed position within said probe tip structure.

4. A probe tip structure according to claim 1 or 2, wherein said contacting member is mechanically resilient.

5. A probe tip structure according to claim 1 or 2 being electrically and mechanically connected to said shield of said coaxial transmission line and further having a portion of said inner conductor extending beyond said shield and said insulating sheath to form a contacting member adapted to contact a device to be tested.

6. An electrical probe device according to claim 5 in which said contacting member is mechanically resilient.

7. A probe tip structure according to claim 6 having an auxiliary electrically conductive contacting element attached to an end of said contacting member to improve the reliability of the electrical contact to said device to be tested and/or improve the wearability of the contacting element.

8. A probe tip structure for connection to a coaxial transmission line having an inner conductor and a shield for testing electronic circuits, said probe tip structure formed from a solid piece of electrically conducting material having first and second ends and further having a bore therein, said bore is symmetrical about its axis, and extends from said first end to said second end where at least two contacting members are located having ends adapted for contacting the circuit to be tested, a first of said two members being adapted for connection to said inner conductor of said coaxial transmission line and a second of said two contacting members being adapted for connection to said shield of said coaxial transmission line.

9. A probe tip structure according to claim 8 wherein at least one of said contacting members is mechanically resilient.

10. A probe tip structure according to claim 8 or 9 including auxiliary electrically conductive elements attached to said contacting ends of said contacting members to improve the reliability and/or the wearability of the electrical contact.

11. A probe tip structure for connection to a coaxial transmission line having an inner conductor and a shield for testing electronic circuits, said probe tip structure consisting of a rod of a solid piece of material having first and second ends and further having a bore therein at said first end and further having at said second end a web machined in said solid piece of material, said web further having a space machined therein resulting in at least two spaced apart contact points.

12. The probe tip structure of claim 11, wherein one of said at least two contact points has been removed.

13. The probe tip structure of claim 11 or 12 including a downwardly sloping section at a free end of said web.

14. The probe tip structure of claim 11, 12 or 13 including at least one size reduction step on said rod of said solid material.

15. The probe tip structure according to claim 11, wherein said spacing between said two spaced apart contact points is chosen to control the impedance of said probe tip structure.

16. The probe tip structure according to claim 11 including an integral and downwardly sloping section on the forward end of said shelf.

17. The probe tip structure according to claim 1 including integral and downwardly projecting contact tips on said contacting member and said inner conductor.

18. The probe tip structure according to claim 1, 8 or 11, wherein said contact members are wider when compared to their thickness.

19. The probe tip structure according to claim 8 including integral and downwardly projecting contact tips on said contacting members.

* * * * *